(12) United States Patent
Apalkov et al.

(10) Patent No.: US 8,446,761 B2
(45) Date of Patent: May 21, 2013

(54) METHOD AND SYSTEM FOR PROVIDING MULTIPLE LOGIC CELLS IN A SINGLE STACK

(75) Inventors: Dmytro Apalkov, San Jose, CA (US); Xueti Tang, Fremont, CA (US); Vladimir Nikitin, Campbell, CA (US); Alexander A. G. Driskill-Smith, Redwood City, CA (US)

(73) Assignee: Grandis, Inc., San Jose, CA (US)

( * ) Notice: Subject to any disclaimer, the term of this patent is extended or adjusted under 35 U.S.C. 154(b) by 95 days.

(21) Appl. No.: 13/031,001

(22) Filed: Feb. 18, 2011

(65) Prior Publication Data

US 2012/0170357 A1     Jul. 5, 2012

Related U.S. Application Data

(60) Provisional application No. 61/429,047, filed on Dec. 31, 2010.

(51) Int. Cl.
*G11C 11/15*     (2006.01)

(52) U.S. Cl.
USPC .......................... 365/173; 365/171; 257/421

(58) Field of Classification Search
USPC ...... 365/171 X, 173 O, 171, 173; 257/421 X, 257/421
See application file for complete search history.

(56) References Cited

U.S. PATENT DOCUMENTS

| | | | | |
|---|---|---|---|---|
| 6,812,537 B2 * | 11/2004 | Okazawa et al. | ............. | 257/421 |
| 7,936,597 B2 * | 5/2011 | Clinton et al. | ................ | 365/173 |
| 8,098,520 B2 * | 1/2012 | Seigler et al. | ................ | 365/173 |

OTHER PUBLICATIONS

PCT International Search Report and Written Opinion of the ISA, application No. PCT/US08/64794.
PCT International Search Report and Written Opinion of the ISA, application No. PCT/US08/66369.
PCT International Search Report and Written Opinion of the ISA, application No. PCT/US10/47941.
PCT International Search Report and Written Opinion of the ISA, application No. PCT/US10/59184.
Office Action issued Apr. 2008 for U.S. Appl. No. 11/239,939.
Office Action issued Sep. 2008 for U.S. Appl. No. 11/239,939.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.

* cited by examiner

*Primary Examiner* — VanThu Nguyen
(74) *Attorney, Agent, or Firm* — Convergent Law Group LLP

(57) ABSTRACT

A method and system for providing a magnetic junction usable in a magnetic device are described. The magnetic junction includes a pinned layer, a plurality of nonmagnetic spacer layers, and a plurality of free layers. The free layers are interleaved with the nonmagnetic spacer layers. A first nonmagnetic spacer layer of the nonmagnetic spacer layers is between the free layers and the pinned layer. Each of the free layers is configured to be switchable between stable magnetic states when a write current is passed through the magnetic junction. Each of the free layers has a critical switching current density. The critical switching current density of one of the free layers changes monotonically from the critical switching current density of an adjacent free layer. The adjacent free layer is between the pinned layer and the one of the plurality of free layers.

23 Claims, 5 Drawing Sheets

METHOD AND SYSTEM FOR PROVIDING MULTIPLE LOGIC CELLS IN A SINGLE STACK

CROSS-REFERENCE TO RELATED APPLICATIONS

This application claims the benefit of provisional Patent Application Ser. No. 61/429,047, filed Dec. 31, 2010, entitled METHOD AND SYSTEM FOR PROVIDING MULTIPLE LOGIC CELLS IN A SINGLE STACK, assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the conventional free layer 20 toward the conventional AFM layer 14, the magnetization 21 of the conventional free layer 20 may switch to be parallel to the magnetization 17 of the conventional pinned layer 16. When a sufficient current is driven from the conventional AFM layer 14 toward the conventional free layer 20, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Although the conventional MTJ 10 may be written using spin transfer and used in an STT-RAM, there are drawbacks. Magnetic memories are desired to have a high density. Use of the conventional MTJ 10 as a memory element in STT-RAM may not provide the desired density given the areal requirements of the conventional MTJ 10 and associated circuitry. FIG. 2 depicts a conventional memory cell 50 that is a solution for providing a higher density memory using the conventional MTJ 10. The conventional memory cell 50 stacks multiple conventional MTJs 10. For clarity, the conventional MTJs are labeled 10', 10", and 10'". Each MTJ 10'/10"/10'" is separated by a nonmagnetic, metallic spacer 52. The conventional cell 50 might also include contacts (not shown) as well as a selection device (not shown), such as a transistor. In operation, the conventional MTJs 10', 10", and 10'" are switched using different switching currents. Each conventional MTJ 10', 10", and 10'" also has two stable states. Thus, the combination of the MTJs 10', 10", and 10'" in the memory cell 50 may store three bits (e.g. logical states 000, 001, 010, 011, 100, 101, 110, 111).

Although the conventional memory cell 50 functions, there are drawbacks. Fabrication of the conventional memory cell 50 may be challenging. Each conventional MTJ 10', 10", and 10'" is typically on the order of thirty-sixty nanometers thick. Further, each conventional metallic spacer 52 is typically ten to fifteen nanometers thick. Thus, the total stack height of the memory cell 50 may be on the order of one hundred nanometers or more. In contrast, the width of the stack for the memory cell 50 is on the order of tens of nanometers. Fabrication of a structure having such a high aspect ratio may be challenging and yield may be poor.

Accordingly, what is needed is a method and system that may improve the density of the spin transfer torque based memories without significantly complicating processing or reducing yield. The method and system described herein address such a need.

BRIEF SUMMARY OF THE INVENTION

A method and system for providing a magnetic junction usable in a magnetic device are described. The magnetic junction includes a pinned layer, a plurality of nonmagnetic spacer layers, and a plurality of free layers. The plurality of free layers are interleaved with the plurality of nonmagnetic spacer layers. A first nonmagnetic spacer layer of the plurality of nonmagnetic spacer layers is between the plurality of free layers and the pinned layer. Each of the plurality of free layers is configured to be switchable between a plurality of stable magnetic states when a write current is passed through the magnetic junction. Each of the plurality of free layers has a critical switching current density. The critical switching current density of one of the plurality of free layers changes monotonically from the critical switching current density of an adjacent free layer of the plurality of free layers. The adjacent free layer is between the pinned layer and the one of the plurality of free layers.

DETAILED DESCRIPTION OF THE INVENTION

Figure 1:
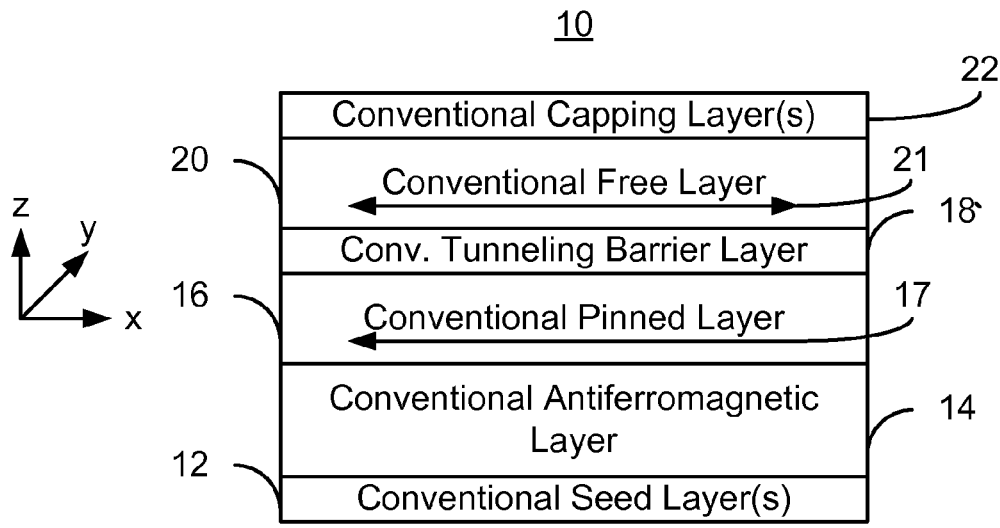
FIG. 1 depicts a conventional magnetic junction.
Figure 2:
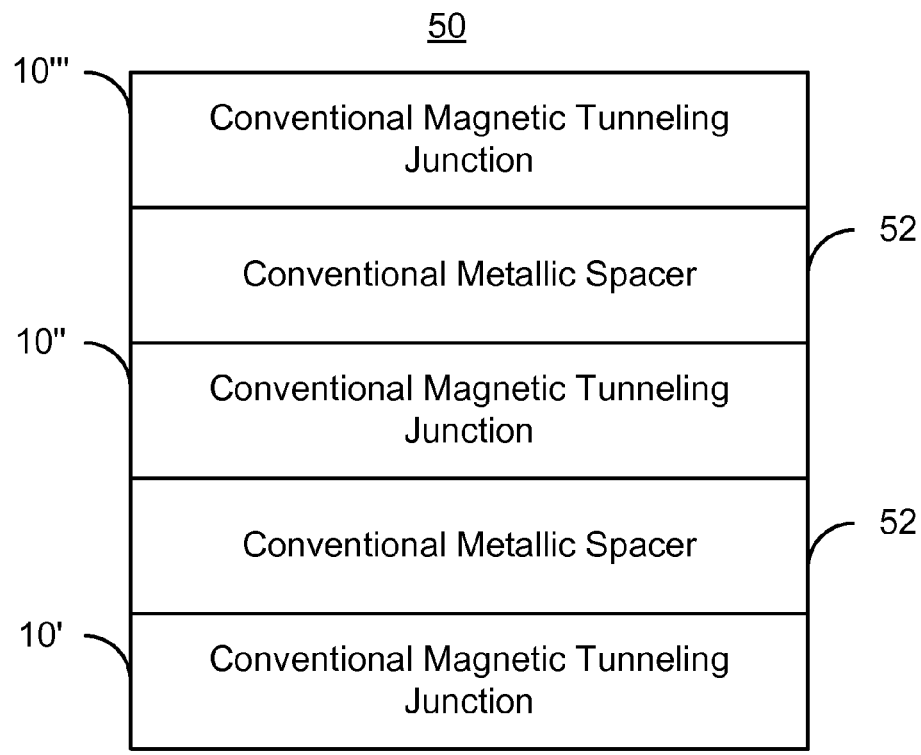
FIG. 2 depicts a conventional memory cell including multiple conventional MTJs.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a plurality of nonmagnetic spacer layers, and a plurality of free layers. The plurality of free layers are interleaved with the plurality of nonmagnetic spacer layers. A first nonmagnetic spacer layer of the plurality of nonmagnetic spacer layers is between the plurality of free layers and the pinned layer. Each of the plurality of free layers is configured to be switchable between a plurality of stable magnetic states when a write current is passed through the magnetic junction. Each of the plurality of free layers has a critical switching current density. The critical switching current density of one of the plurality of free layers changes monotonically from the critical switching current density of an adjacent free layer of the plurality of free layers. The adjacent free layer is between the pinned layer and the one of the plurality of free layers.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction.

Conversely, "perpendicular" corresponds to a direction that is substantially perpendicular to one or more of the layers of the magnetic junction.

Figure 3:
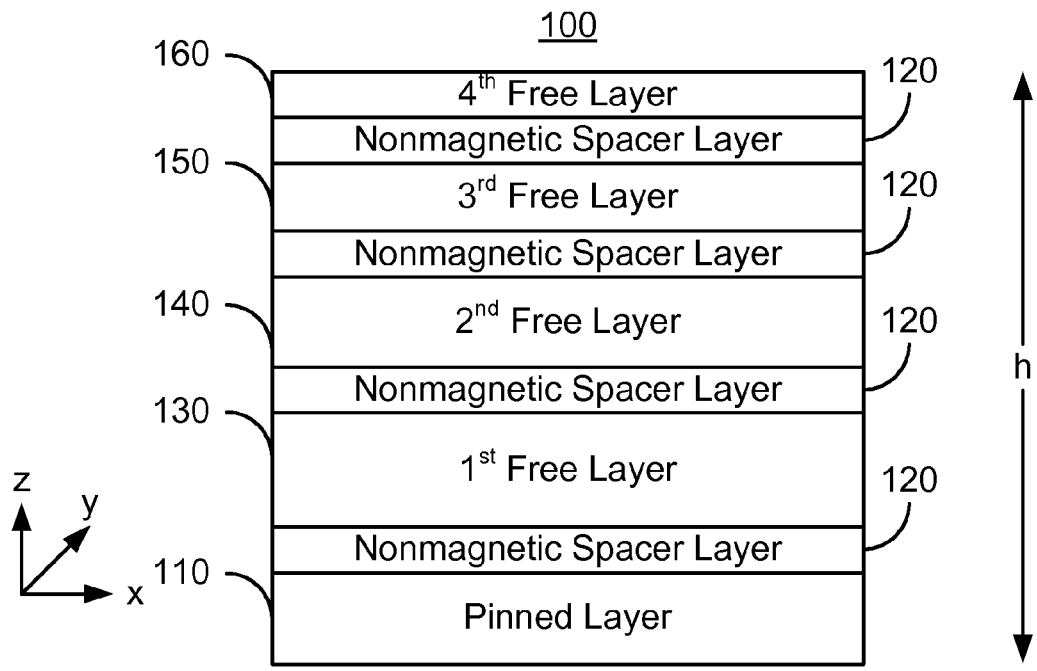
FIG. 3 depicts an exemplary embodiment of a magnetic junction capable of storing multiple bits.

FIG. 3 depicts an exemplary embodiment of a magnetic junction 100 usable in a magnetic memory, such as an STT-RAM. For clarity, FIG. 3 is not to scale. The magnetic junction 100 includes a pinned layer 110, a plurality of nonmagnetic spacer layers 120, and free layers 130, 140, 150, and 160. Although four free layers 130, 140, 150, and 160 and four nonmagnetic spacer layers 120 are shown, another number may be used. Although not shown, an optional seed layer, an optional pinning layer, and an optional capping layer may be used. The optional pinning layer may be used to fix the magnetization (not shown) of the pinned layer 110. In some embodiments, the optional pinning layer may be an AFM layer or multilayer that pins the magnetization (not shown) of the pinned layer 110 by an exchange-bias interaction. However, in other embodiments, the optional pinning layer may be omitted or another structure may be used.

Although depicted as a simple layer, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 110 may also be another multilayer. Although a magnetization is not depicted in FIG. 3, the pinned layer 110 may have a perpendicular anisotropy energy that exceeds the out-of-plane demagnetization energy ($4\pi M_s$). Thus, the pinned layer 110 may have its magnetic moment oriented perpendicular to plane. In other embodiments, the magnetic moment of the pinned layer 110 is in-plane, for example if the perpendicular anisotropy energy is less than the out-of-plane demagnetization energy. Other orientations of the magnetization of the pinned layer 110 are possible. In some embodiments, the pinned layer 110 is also desired to have a high saturation magnetization and high damping.

Each of the spacer layers 120 is nonmagnetic. In some embodiments, each spacer layer 120 is an insulator, for example a tunneling barrier. In such embodiments, each spacer layer 120 may include crystalline MgO, which may enhance the TMR of the magnetic junction. In other embodiments, each spacer layer 120 may be a conductor, such as Cu. In alternate embodiments, each spacer layer 120 might have another structure, for example a granular layer including conductive channels in an insulating matrix. Finally, in other embodiments, the spacer layers 120 may differ in structure. For example, some spacer layers 120 might be conductive while others are insulating. Such spacer layers 120 may thus alternate in conductivity or have some other relationship.

The free layers 130, 140, 150, and 160 are interleaved with the nonmagnetic spacer layers 120. Further, all of the free layers 130, 140, 150, and 160 are separated from the pinned layer 110 by one of the nonmagnetic spacer layers 120. Stated differently, in the embodiment shown in FIG. 3, the closest free layer 130 is separated from the pinned layer 110 by a nonmagnetic spacer layer 120. Thus, the magnetic junction 100 may thought of as a junction having one pinned layer and multiple free layers 130, 140, 150, and 160. Note that in another embodiment (not shown), an additional nonmagnetic spacer layer and pinned layer may be provided. Such an embodiment could be considered analogous to a dual magnetic junction having multiple free layers 130, 140, 150, and 160.

The free layers 130, 140, 150, and 160 are each magnetic and thus include at least one of Co, Ni, and Fe. Each of the free layers 130, 140, 150, and 160 is configured to be switchable between a plurality of stable magnetic states when a write current is passed through the magnetic junction 100. Further, each of the free layers 130, 140, 150, and 160 has a critical switching current density. No two free layers free layers 130, 140, 150, and 160 have the same critical switching current density. Thus, each free layer 130, 140, 150, and 160 also has its own critical current required to switch the magnetization of the free layer 130, 140, 150, and 160. In some embodiments, the critical switching current density of the free layers 130, 140, 150, and 160 changes monotonically with distance from the pinned layer 110. Stated differently, the critical switching current density of one of the free layers 140, 150, and 160 changes monotonically from the critical switching current density of an adjacent free layer 130, 140, and 150, respectively. In some embodiments, the critical switching current density of each of the plurality of free layers decreases monotonically with increasing distance from the pinned layer 110. In such embodiments, the free layer 130 has the highest critical switching current density, the free layer 140 has the second highest critical switching current density, the free layer 150 has the third highest critical switching current density, and the free layer 160 has the lowest critical switching current density. In other embodiments, the critical switching current density of each of the free layers 130, 140, 150, and 160 increases monotonically with increasing distance from the pinned layer 110. In such embodiments, the free layer 130 has the lowest critical switching current density, the free layer 140 has the second lowest critical switching current density, the free layer 150 has the third lowest critical switching current density, and the free layer 160 has the highest critical switching current density. Such a magnetic junction 100 is depicted in FIG. 4.

Figure 4:
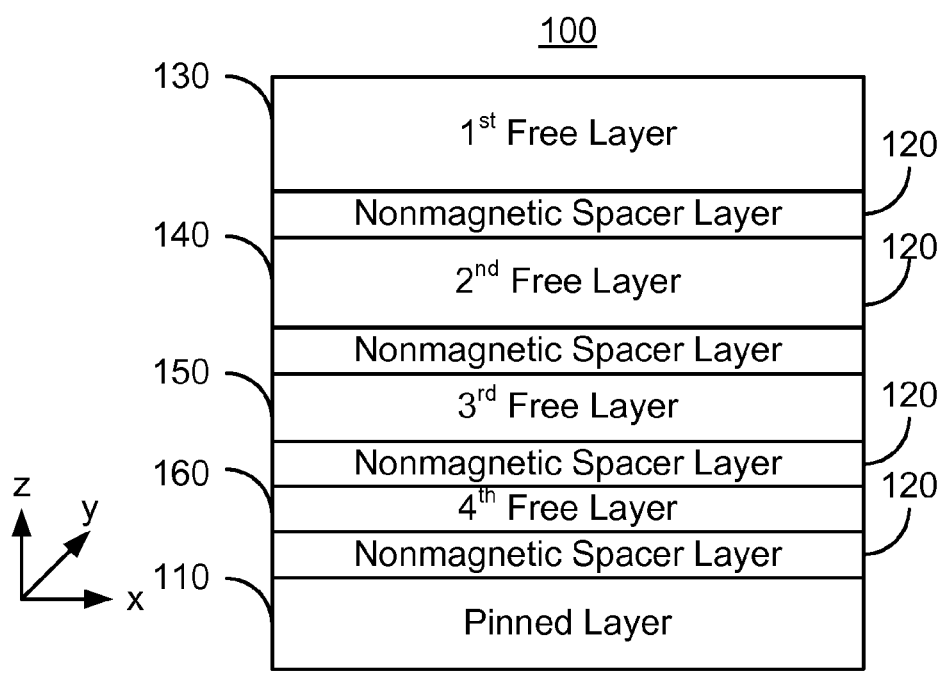
FIG. 4 depicts another exemplary embodiment of a magnetic junction capable of storing multiple bits.

Referring to FIGS. 3-4, the magnetic moments of the free layers 130, 140, 150, and/or 160 may be in plane (e.g. substantially parallel to the x-y plane), perpendicular to plane (e.g. substantially parallel to the z-axis), or have components both in plane and perpendicular to plane. In embodiments in which the magnetic moments of the free layers 130, 140, 150, and/or 160 have components in plane and perpendicular to plane, the free layers 130, 140, 150, and/or 160 may have an easy-cone anisotropy. In such embodiments, the free layer 130, 140, 150, and/or 160 has a stable state when its magnetic moment is a particular angle from the z-axis. In some embodiments, each of the free layers 130, 140, 150, and 160 have a demagnetization energy and a perpendicular anisotropy energy that is greater than the demagnetization energy. In such an embodiment, each of the free layers 130, 140, 150, and 160 has its magnetization perpendicular to plane. In some such embodiments, the pinned layer 110 is also desired to have its magnetization perpendicular to plane. However, other orientations are possible. In other embodiments, each of the free layers 130, 140, 150, and 160 has a perpendicular anisotropy energy that is less than the demagnetization energy. In such embodiments, each of the free layers 130, 140, 150, and 160 has its magnetization in plane. In some such embodiments, the pinned layer 110 also has its magnetization in plane. However, other orientations are possible. In still other embodiments, the free layers 130, 140, 150, and 160 need not be all in plane, all perpendicular to plane or all a mixture. Instead, there may be a mix of one or more of these orientations for the magnetizations of the free layers 130, 140, 150, and 160.

The free layers 130, 140, 150, and 160 are depicted as simple layers. However, the free layers 130, 140, 150, and/or 160 may have sublayers. For example, one or more of the free layers 130, 140, 150, and/or 160 may be a SAF. In other embodiments, one or more of the free layers 130, 140, 150, and/or 160 might be a bilayer including two magnetic layers, such as CoFe and CoFeB. In another embodiment, one or more of the free layer 130, 140, 150, and/or 160 may include ferromagnetic layers that are magnetically coupled through nonmagnetic insertion layers. For example, the ferromagnetic layers might be exchange coupled. Some ferromagnetic layers may be perpendicular, while other may be weakly in-plane (perpendicular anisotropy energy at least 0.4 of but less than the demagnetization energy). In such embodiments, the free layer 130, 140, 150, and/or 160 may have an easy-cone anisotropy.

The free layers 130, 140, 150, and/or 160 are also configured to be stable at room temperature. For example, the magnetic anisotropy energies for the free layers 130, 140, 150, and/or 160 may be at least at least sixty times $k_bT$. In some embodiments, the magnetic anisotropy energies for the free layers 130, 140, 150, and/or 160 are at least eighty times $k_bT$ at room temperature (approximately thirty degrees centigrade).

The magnetic junction 100 may store multiple bits, yet be relatively easily fabricated. For example, in the magnetic junction 100 depicted in FIG. 3, the free layer 130 has the highest critical switching current density. Thus, a write current may be applied that has a magnitude such that the critical switching current density of the free layer 130 is exceeded. The direction of the current (+z or −z direction) depends upon the state desired to be written and the direction of magnetization of the pinned layer 110. Thus, the free layer 130 may be programmed. Another write current may then be applied to write to the free layer 140. This write current is such that the current density through the magnetic junction 100 is less than the critical switching current density of the free layer 130, but greater than the critical switching current density of the free layer 140. Further, the free layer 130 may act as a pinned layer for the free layer 140. This is because the write current for the free layer 140 should not switch the free layer 130. The direction of the current depends upon the desired state to be written to the free layer 140 and on the state in which the free layer 130 remains. Thus, the free layer 140 may be programmed. A third write, lower, current may then be applied to write to the free layer 150. This write current is such that the current density through the magnetic junction 100 is less than the critical switching current density of the free layer 140, but greater than the critical switching current density of the free layer 150. Further, the free layer 140 may act as a pinned layer for the free layer 150. This is because the write current for the free layer 150 should not switch the free layer 140. The direction of the current depends upon the desired state to be written and the state in which the free layer 140 remains. Thus, the free layer 150 may be programmed. A fourth, lower, write current may then be applied to write to the free layer 160. This write current is such that the current density through the magnetic junction 100 is less than the critical switching current density of the free layer 150, but greater than the critical switching current density of the free layer 160. Further, the free layer 150 may act as a pinned layer for the free layer 160. This is because the write current for the free layer 160 should not switch the free layer 150. The direction of the current depends upon the desired state to be written and the state of the free layer 150. Thus, the free layer 160 may be programmed. Consequently, the magnetic junction 100 may be programmed to store multiple bits.

During reading, a read current that is lower than the lowest write current (e.g. for the free layer 140) may be applied. The resistance of the magnetic junction 100 depends upon the combination of orientations of the free layers 130, 140, 150, and 160. For example, a lowest resistance state is when the magnetizations of the free layers 130, 140, 150, and 160 are parallel to each other and to the pinned layer 110. A highest resistance state occurs when the magnetizations of the free layers 130, 140, 150, and 160 are antiparallel to each other and the magnetization of the free layer 130 is antiparallel to that of the pinned layer 110. Thus, depending upon the orientations of the free layers 130, 140, 150, and 160 multiple bits may be stored in a single stack and read from the stack. Thus, density of a memory employing the magnetic junction 100 may be improved.

Further, the stack height, h, may be reduced. The magnetic junction 100 is formed of a pinned layer 110 and multiple free layers 130, 140, 150, and 160. Thus, instead of having a conventional MTJ and metallic spacer for each bit stored (approximately twenty-sixty nm in height per bit), only a nonmagnetic spacer layer and free layer (on the order of 10-15 nm or less per bit) are used. In some embodiments, the magnetic junction 100 may have a height on the order of twenty to thirty nanometers or less. As a result, the magnetic junction 100 does not have as high an aspect ratio. Consequently, fabrication of the magnetic junction 100 may be simplified and yield may be improved.

Figure 5:
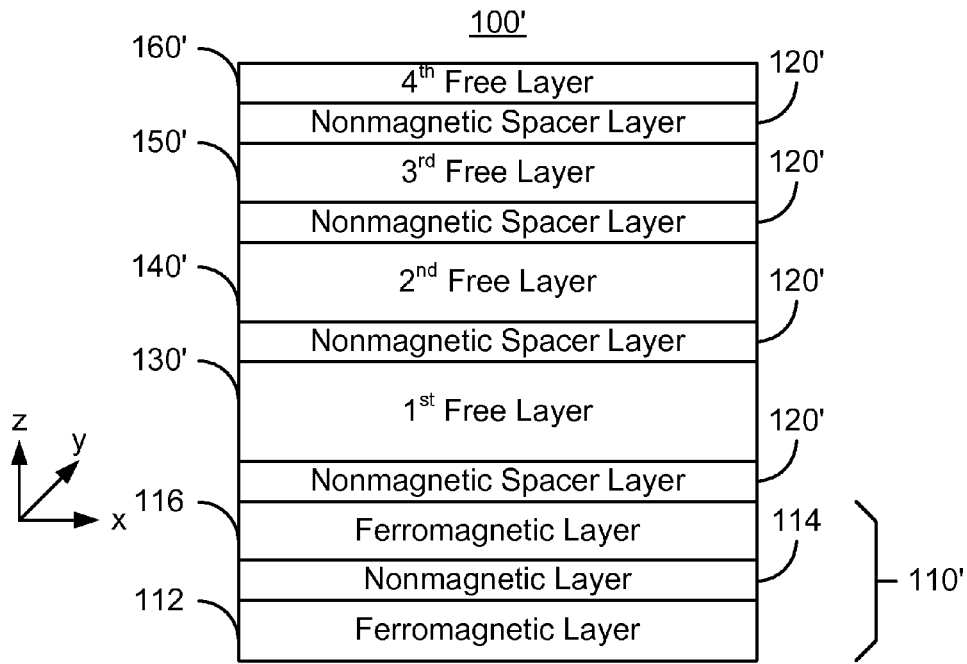
FIG. 5 depicts another exemplary embodiment of a magnetic junction capable of storing multiple bits.
Figure 6:
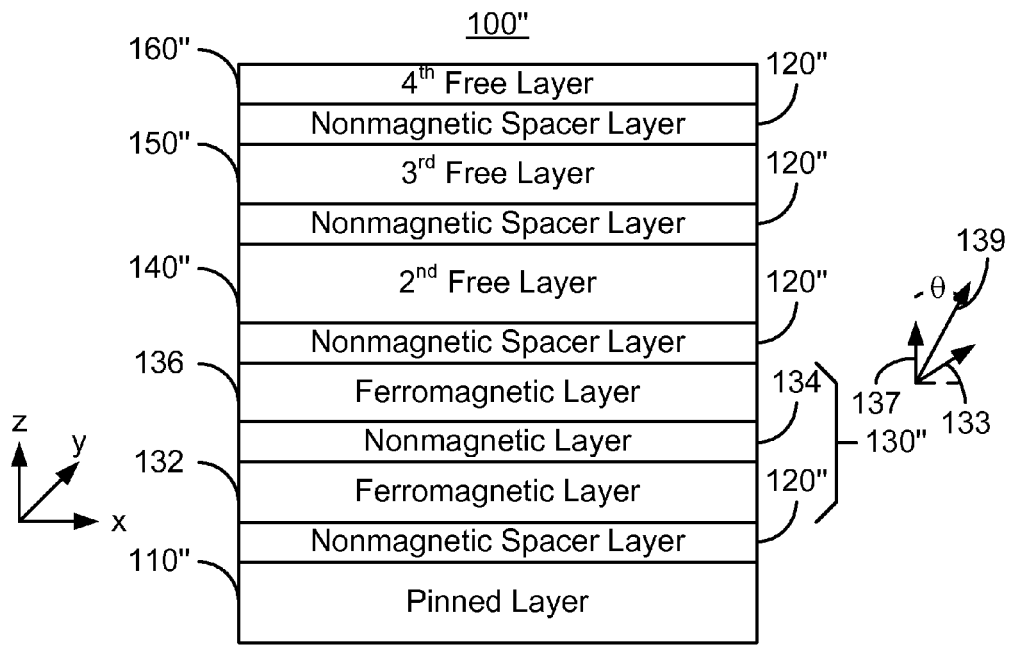
FIG. 6 depicts another exemplary embodiment of a magnetic junction capable of storing multiple bits.
Figure 7:
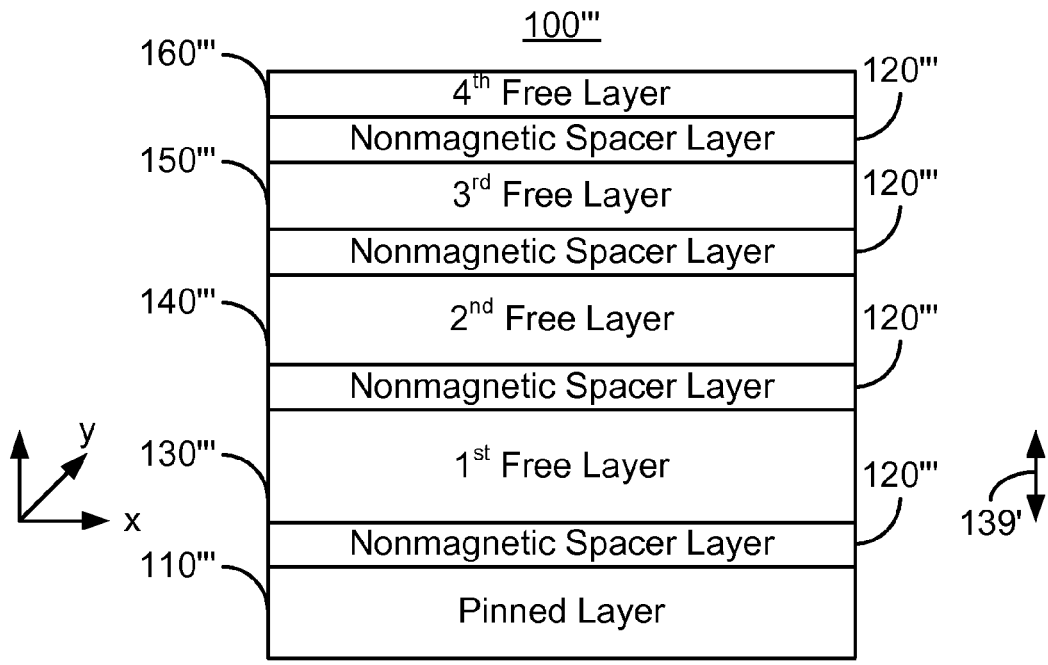
FIG. 7 depicts another exemplary embodiment of a magnetic junction capable of storing multiple bits.

FIGS. 5-7 depict various embodiments of magnetic junctions 100', 100", and 100'''. Although different features are highlighted in the magnetic junctions 100, 100', 100", and 100'', the features of one or more of the magnetic junctions 100, 100', 100", and/or 100''' may be combined. FIG. 5 depicts an exemplary embodiment of a magnetic junction 100' usable in a magnetic memory such as an STT-RAM. For clarity, FIG. 5 is not to scale. The magnetic junction 100' is analogous to the magnetic junction 100. Consequently, analogous components are labeled similarly. The magnetic junction 100' thus includes pinned layer 110', nonmagnetic spacer layers 120', and free layers 130', 140', 150', and 160' that are analogous to the pinned layer 110, the nonmagnetic spacer layers 120, and the free layers 130, 140, 150, and 160, respectively. Although layers 110', 120', 130', 140', 150', and 160' are shown with a particular geometric orientation, this orientation may vary in other embodiments. For example, the pinned layer 110' may be at the top (furthest from a substrate that is not shown) of the magnetic junction 100'. Although four free layers 130', 140', 150', and 160' and four nonmagnetic spacer layers 120' are shown, another number may be used. Although not shown, an optional seed layer, an optional pinning layer, and an optional capping layer may be used. The optional pinning layer may be used to fix the magnetization (not shown) of the pinned layer 110'. In some embodiments, the optional pinning layer may be an AFM layer or multilayer that pins the magnetization (not shown) of the pinned layer 110' by an exchange-bias interaction. However, in other embodiments, the optional pinning layer may be omitted or another structure may be used.

The structure and operation of the layers 110', 120', 130', 140', 150', and 160' are analogous to that of the layers 110, 120, 130, 140, 150, and 160. In addition, the pinned layer 110' includes multiple layers. In particular, the pinned layer 110' shown is a SAF including ferromagnetic layers 132 and 136 separated by a nonmagnetic layer 134. The ferromagnetic layers 132 and 136 may be antiferromagnetically or ferromagnetically coupled.

The magnetic junction 100' shares the benefits of the magnetic junction 100. In particular, multiple bits may be stored in a single stack/magnetic junction 100'. Further, the stack height of the magnetic junction 100' may be reduced. Consequently, the magnetic junction 100' does not have as high an aspect ratio. Fabrication of the magnetic junction 100' may thus be simplified and yield may be improved.

FIG. 6 depicts an exemplary embodiment of a magnetic junction 100" usable in a magnetic memory such as an STT-RAM. For clarity, FIG. 6 is not to scale. The magnetic junction 100" is analogous to the magnetic junctions 100/100'. Consequently, analogous components are labeled similarly. The magnetic junction 100" thus includes pinned layer 110", nonmagnetic spacer layers 120", and free layers 130", 140", 150", and 160" that are analogous to the pinned layer 110/110', the nonmagnetic spacer layers 120/120', and the free layers 130/130', 140/140', 150/150', and 160/160', respectively. Although layers 110", 120", 130", 140", 150", and 160" are shown with a particular geometric orientation, this orientation may vary in other embodiments. For example, the pinned layer 110" may be at the top (furthest from a substrate that is not shown) of the magnetic junction 100". Although four free layers 130", 140", 150", and 160" and four nonmagnetic spacer layers 120" are shown, another number may be used. Although not shown, an optional seed layer, an optional pinning layer, and an optional capping layer may be used. The optional pinning layer may be used to fix the magnetization (not shown) of the pinned layer 110". In some embodiments, the optional pinning layer may be an AFM layer or multilayer that pins the magnetization (not shown) of the pinned layer 110" by an exchange-bias interaction. However, in other embodiments, the optional pinning layer may be omitted or another structure may be used.

The structure and operation of the layers 110", 120", 130", 140", 150", and 160" are analogous that of the layers 110/110', 120/120', 130/130', 140/140', 150/150', and 160/160', respectively. In addition, the free layer 130" is depicted as including multiple sublayers 132, 134, and 136. In the embodiment shown, the ferromagnetic layers 132 and 136 are ferromagnetic while the layer 134 is nonmagnetic. In some embodiments, therefore the free layer 130" may be a SAF. However, in other embodiments, such as that shown, the free layer 130" may have its magnetization canted from the z-axis (perpendicular to plane) and may have an easy cone anisotropy. In the embodiment shown, the ferromagnetic layer 132 has a weak in-plane anisotropy. In some embodiments, this corresponds to a perpendicular anisotropy energy that it at least 40% of and not more than the out-of-plane demagnetization energy. Thus, without more, the layer 132 would have its magnetization 133 in plane. However, the ferromagnetic layer 136 has its magnetization 137 strongly perpendicular to plane. In addition, the layers 132 and 136 are exchange coupled through the layer 134. Thus, the magnetization 133 is pulled partially out of plane. The net magnetization 139 of the free layer 130 is canted at an angle of θ from the direction perpendicular to plane. Having its net magnetization 139 canted from perpendicular to plane may make the free layer 130" switch more easily and faster. Further, although only the ferromagnetic layer 130" is shown has including multiple sublayers, other free layer 140", 150", and/or 160" may have an analogous structure.

The magnetic junction 100" shares the benefits of the magnetic junctions 100/100'. In particular, multiple bits may be stored in a single stack/magnetic junction 100", allowing for a denser memory. Further, the stack height of the magnetic junction 100" may be reduced. Consequently, the magnetic junction 100" does not have as high an aspect ratio. Fabrication of the magnetic junction 100" may thus be simplified and yield may be improved. In addition, the magnetic junction 100" may be easier and/or faster to switch and have a lower write error rate. Consequently, performance may be improved.

FIG. 7 depicts an exemplary embodiment of a magnetic junction 100''' usable in a magnetic memory such as an STT-RAM. For clarity, FIG. 7 is not to scale. The magnetic junction 100''' is analogous to the magnetic junctions 100/100'/100". Consequently, analogous components are labeled similarly. The magnetic junction 100''' thus includes pinned layer 110''', nonmagnetic spacer layers 120''', and free layers 130''', 140''', 150''', and 160''' that are analogous to the pinned layer 110/110'/110", the nonmagnetic spacer layers 120/120'/120", and the free layers 130/130'/130", 140/140'/140", 150/150'/150", and 160/160'/160", respectively. Although layers 110''', 120''', 130''', 140''', 150''', and 160''' are shown with a particular geometric orientation, this orientation may vary in other embodiments. For example, the pinned layer 110''' may be at the top (furthest from a substrate that is not shown) of the magnetic junction 100'''. Although four free layers 130''', 140''', 150''', and 160''' and four nonmagnetic spacer layers 120''' are shown, another number may be used. Although not shown, an optional seed layer, an optional pinning layer, and an optional capping layer may be used. The optional pinning layer may be used to fix the magnetization (not shown) of the pinned layer 110'''. In some embodiments, the optional pinning layer may be an AFM layer or multilayer that pins the magnetization (not shown) of the pinned layer 110''' by an exchange-bias interaction. However, in other embodiments, the optional pinning layer may be omitted or another structure may be used.

The structure and operation of the layers 110''', 120''', 130''', 140''', 150''', and 160''' are analogous that of the layers 110/110'/110", 120/120'/120", 130/130'/130", 140/140'/140", 150/150'/150", and 160/160'/160", respectively. In addition, the free layer 130''' is depicted as having a perpendicular magnetization 139'. Note that although shown as a simple layer, the first free layer 130''' may have multiple sublayers. Further, although only the ferromagnetic layer 130''' is shown has having a perpendicular magnetization, other free layer 140''', 150''', and/or 160''' may have an analogous structure.

The magnetic junction 100''' shares the benefits of the magnetic junctions 100/100'/100". In particular, multiple bits may be stored in a single stack/magnetic junction 100''', allowing for a denser memory. Further, the stack height of the magnetic junction 100''' may be reduced. Consequently, the magnetic junction 100''' does not have as high an aspect ratio. Fabrication of the magnetic junction 100''' may thus be simplified and yield may be improved. In addition, the magnetic junction 100''' may be easier and/or faster to switch because of the perpendicular magnetization 139'. Consequently, performance may be improved.

Figure 8:
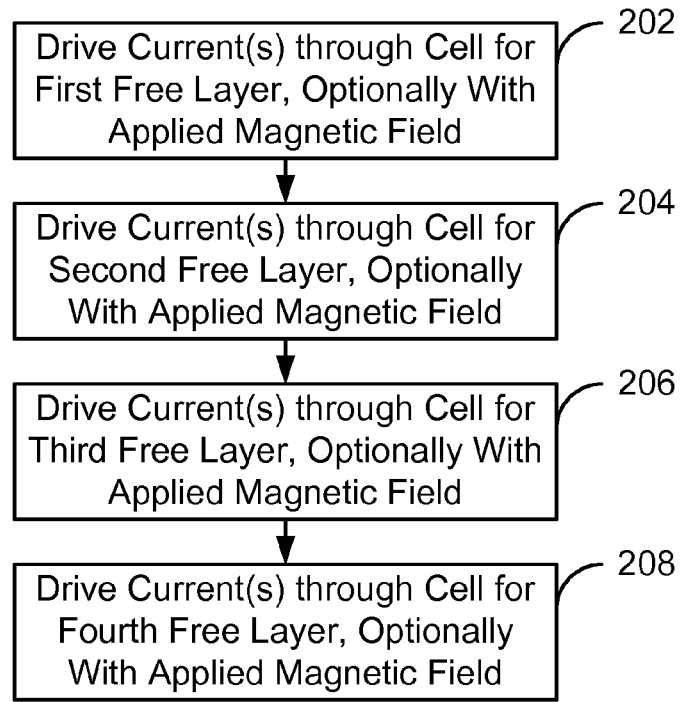
FIG. 8 depicts an exemplary embodiment of a method for programming a magnetic junction capable of storing multiple bits.

FIG. 8 depicts an exemplary embodiment of a method 200 for programming a magnetic junction such as the magnetic junction 100, 100', 100", and/or 100'''. For simplicity, some steps may be omitted, combined, or interleaved. The method 200 is described in the context of the magnetic junction 100. However, the method 200 may be used to write to other magnetic junctions such as the junctions 100', 100" and/or 100'''. Further, the method 200 may be used in the context of magnetic junctions 100, 100', 100", and/or 100''' that are incorporated into fabrication of magnetic memories. Thus the method 200 may be used in the context of a STT-RAM or other magnetic memory. Although described as multiple steps, the method 200 may be viewed as simply applying a plurality of write currents to the magnetic junction 100. Each of the write currents corresponds to the critical switching current density of one of the free layers 130, 140, 150, and 160.

A write current is driven through the magnetic junction 100 to program the first (highest critical write current density) free layer 130, via step 202. In some embodiments, the write current applied in step 202 is a direct current pulse that has an amplitude corresponding to the critical current density of the free layer 130. Thus, the amplitude is such that the current density through the magnetic junction 100 is greater than the critical switching current density of the free layer 130. In other embodiments, the current applied in step 202 may employ both amplitude selection and frequency selection. For example, each of the free layers 130, 140, 150, and 160 may have a characteristic, Larmor frequency. The Larmor frequency of a particular free layer 130, 140, 150, and/or 160 may be tailored by adjusting parameters such as the magnetic anisotropy, the saturation magnetization and any perpendicular anisotropy. In such an embodiment, the write current applied in step 202 may include a direct current (DC) component and an alternating current (AC) component. The DC component has an amplitude corresponding to the critical current density of the free layer 130. Thus, the DC component has an amplitude such that the current density through the magnetic junction 100 has an amplitude greater than the critical switching current density of the free layer 130. The AC component having a frequency corresponding to, for example equal to, the Larmor frequency of the free layer 130. In another embodiment, the direct current component and/or pulse described above may optionally be supplemented with an applied external magnetic field in the direction to which the free layer 130 is desired to be switched. Finally, in yet another embodiment, step 202 includes providing a series of write current pulses. The pulses have an amplitude corresponding to the critical current density of the free layer 130 and a frequency corresponding to the Larmor frequency of the free layer 130. Thus, the amplitude of the pulses may be sufficient to provide a current density in the magnetic junction 100 that is greater than the critical switching current density of the free layer 130 and a frequency equal to the Larmor frequency of the free layer 130. The Larmor frequency relates to the precession of the magnetic moment of the free layer 130. In some embodiments, the Larmor frequency, $\omega$, is given by:

$$\omega = \gamma \sqrt{H_K(H_K + 4\pi M_S - H_K^\perp)}$$

Where
$\gamma$ is the gyromagnetic ratio for the magnetic moment of the free layer;
$H_K$ is the in-plane anisotropy field;
Ms is saturation magnetization; and
$H_K^\perp$ is the out-of-plane anisotropy field (assumed to be smaller than the demagnetization field $4\pi M_s$ in this expression).

A write current is driven through the magnetic junction 100 to program the second (next highest critical write current density) free layer 140, via step 204. In some embodiments, the write current applied in step 204 is a direct current pulse having an amplitude corresponding to the critical current density of the free layer 140. Thus, the amplitude is such that the current density through the magnetic junction 100 is greater than the critical switching current density of the free layer 140 and less than the critical switching current density of the free layer 130. In other embodiments, the current applied in step 204 may employ both amplitude selection and frequency selection. For example, the write current applied in step 204 may include a DC component and an AC component. The DC component has an amplitude corresponding to the critical current density of the free layer 140. Thus, the DC component has an amplitude such that the current density through the magnetic junction has an amplitude greater than the critical switching current density of the free layer 140 and less than the critical switching current density of the free layer 130. The AC component having a frequency corresponding to, for example equal to, the Larmor frequency of the free layer 140. In another embodiment, the direct current component and/or pulse described above may optionally be supplemented with an applied external magnetic field in the direction to which the free layer 140 is desired to be switched. Finally, in yet another embodiment, step 204 includes providing a series of write current pulses. The pulses have an amplitude corresponding to the critical current density of the free layer 140 and a frequency corresponding to the Larmor frequency of the free layer 140. Thus, the amplitude of the pulses may be sufficient to provide a current density in the magnetic junction 100 that is greater than the critical switching current density of the free layer 140 but less than the critical switching current density of the free layer 130. The pulses may also have a frequency equal to the Larmor frequency of the free layer 140.

A write current is driven through the magnetic junction 100 to program the third (third highest critical write current density) free layer 150, via step 206. In some embodiments, the write current applied in step 206 is a direct current pulse having an amplitude corresponding to the critical current density of the free layer 150. Thus, the amplitude is such that the current density through the magnetic junction 100 is greater than the critical switching current density of the free layer 150 and less than the critical switching current density of the free layer 140. In other embodiments, the current applied in step 206 may employ both amplitude selection and frequency selection. For example, the write current applied in step 206 may include a DC component and an AC component. The DC component has an amplitude corresponding to the critical current density of the free layer 150. Thus, the DC component has an amplitude such that the current density through the magnetic junction has an amplitude greater than the critical switching current density of the free layer 150 and less than the critical switching current density of the free layer 140. The AC component having a frequency corresponding to, for example equal to, the Larmor frequency of the free layer 150. In another embodiment, the direct current component and/or pulse described above may optionally be supplemented with an applied external magnetic field in the direction to which the free layer 150 is desired to be switched. Finally, in yet another embodiment, step 206 includes providing a series of write current pulses. The pulses have an amplitude corresponding to the critical current density of the free layer 150 and a frequency corresponding to the Larmor frequency of the free layer 150. Thus, the amplitude of the pulses may be sufficient to provide a current density in the magnetic junction 100 that is greater than the critical switching current density of the free layer 150 but less than the critical switching current density of the free layer 140. The pulses may also have a frequency equal to the Larmor frequency of the free layer 150.

A write current is driven through the magnetic junction 100 to program the fourth (lowest critical write current density) free layer 160, via step 208. In some embodiments, the write current applied in step 208 is a direct current pulse having an amplitude corresponding to the critical current density of the free layer 160. Thus, the amplitude is such that the current density through the magnetic junction 100 is greater than the critical switching current density of the free layer 160 and less than the critical switching current density of the free layer 150. In other embodiments, the current applied in step 208 may employ both amplitude selection and frequency selection. For example, the write current applied in step 208 may include a DC component and an AC component. The DC component has an amplitude corresponding to the critical current density of the free layer 160. Thus, the DC component has an amplitude such that the current density through the magnetic junction has an amplitude greater than the critical switching current density of the free layer 160 and less than the critical switching current density of the free layer 150. The AC component having a frequency corresponding to, for example equal to, the Larmor frequency of the free layer 160. In another embodiment, the direct current component and/or pulse described above may optionally be supplemented with an applied external magnetic field in the direction to which the free layer 160 is desired to be switched. Finally, in yet another embodiment, step 208 includes providing a series of write current pulses. The pulses have an amplitude corresponding to the critical current density of the free layer 160 and a frequency corresponding to the Larmor frequency of the free layer 160. Thus, the amplitude of the pulses may be sufficient to provide a current density in the magnetic junction 100 that is greater than the critical switching current density of the free layer 160 but less than the critical switching current density of the free layer 150. The pulses may also have a frequency equal to the Larmor frequency of the free layer 160.

Thus, using the method 200, the magnetic junction 100 may be programmed. Analogous methods might be used for the magnetic junctions 100', 100", and/or 100'". The benefits of the magnetic junctions 100, 100', 100", and/or 100'" may thus be achieved.

Figure 9:
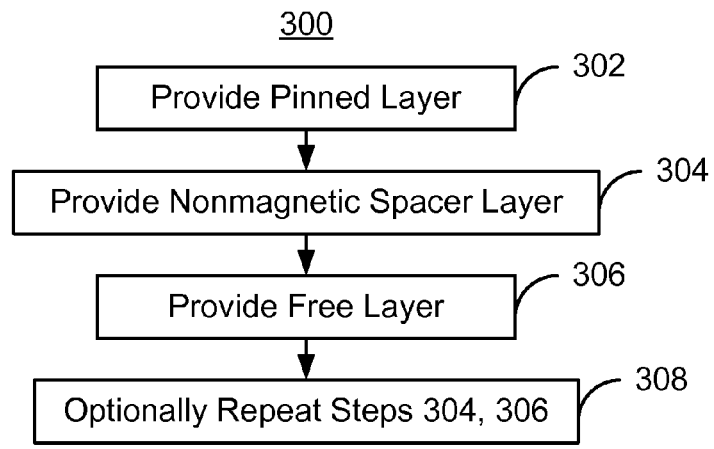
FIG. 9 depicts an exemplary embodiment of a method for providing a magnetic junction capable of storing multiple bits.

FIG. 9 depicts an exemplary embodiment of a method 300 for fabricating magnetic junction. For simplicity, some steps may be omitted, interleaved, or combined. The method 300 is described in the context of the magnetic junction 100. However, the method 300 may be used on other magnetic junctions such as the junctions 100', 100" and/or 100'". Further, the method 300 may be incorporated into fabrication of magnetic memories. Thus the method 300 may be used in manufacturing a STT-RAM or other magnetic memory.

The pinned layer 110 is provided, via step 302. Step 302 may include depositing the desired materials at the desired thickness of the pinned layer 110. One of the nonmagnetic layers 120 is provided, via step 304. Step 304 may include depositing the desired nonmagnetic materials. In addition, the desired thickness of material may be deposited in step 304. The first time step 304 is performed, the nonmagnetic spacer layer 120 adjoining the pinned layer 110 is provided. A free layer is provided, via step 306. The first time step 306 is performed, the free layer 130 is provided. Step 306 may include providing the desired materials and/or sublayers. The steps of providing the nonmagnetic spacer layer 120 and another free layer 140, 150, and/or 160 are optionally repeated, via step 308. However, as multiple bits are desired to be stored, step 308 is performed at least once so that at least the free layer 140 is fabricated. Thus, the magnetic junction 100 having the desired number of free layers and nonmagnetic spacer layers may be provided. Thus, the magnetic junction 100, 100', 100", and/or 100'" is formed. Consequently, the benefits of the magnetic junction may be achieved.

Figure 10:
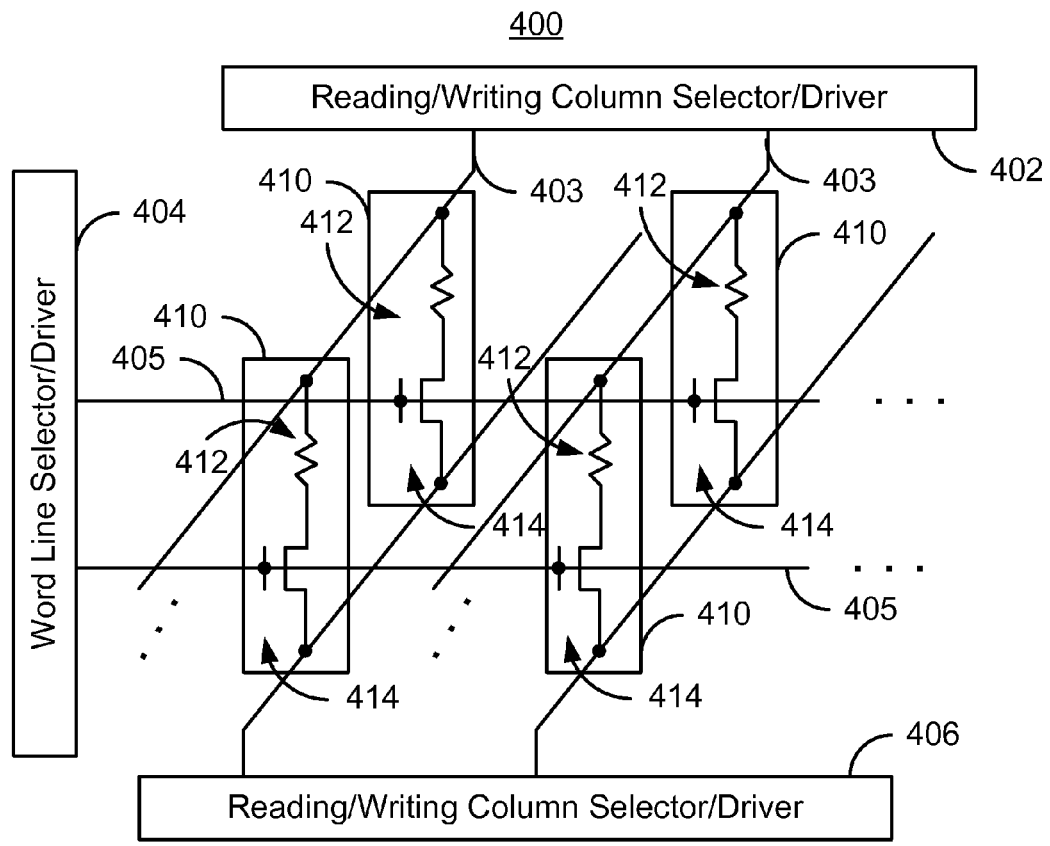
FIG. 10 depicts an exemplary embodiment of a memory utilizing magnetic junctions in the memory element(s) of the storage cell(s).

The magnetic junctions 100, 100', 100", and/or 100'" may be used in a magnetic memory. FIG. 10 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 1, and/or 100'". Although one magnetic junction 412 is shown per cell 410, in other embodiments, another number of magnetic junctions 412 may be provided per cell. As such, the magnetic memory 400 may enjoy the benefits described above, such as higher density.

Various magnetic junctions 100, 100', 100", and 100'" have been disclosed. Note that various features of the magnetic junctions 100, 100', 100", and 100'" may be combined. Thus, one or more of the benefits of the magnetic junctions 100, 100', 100", and 100'" such as reduced write error rate, a perpendicular anisotropy, thermal stability, and/or higher density may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:

a pinned layer;

a plurality of nonmagnetic spacer layers; and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of at least a portion of the plurality of free layers having an easy-cone anisotropy such that a magnetic moment of each of the at least the portion of the plurality of free layers is stable canted at an angle that from a normal to a plane of the plurality of free layers, the angle being greater than zero and less than ninety degrees.

2. The magnetic junction of claim 1 wherein the critical switching current density of each of the plurality of free layers decreases monotonically with increasing distance from the pinned layer.

3. The magnetic junction of claim 1 wherein the critical switching current density of each of the plurality of free layers increases monotonically with increasing distance from the pinned layer.

4. The magnetic junction of claim 1 wherein each of the plurality of free layers has a perpendicular anisotropy energy and a demagnetization energy, the perpendicular anisotropy energy being greater than the demagnetization energy.

5. The magnetic junction of claim 4 wherein the pinned layer has a pinned layer perpendicular anisotropy energy and a pinned layer demagnetization energy, the pinned layer perpendicular anisotropy energy being greater than the pinned layer demagnetization energy.

6. The magnetic junction of claim 1 wherein each of at least a portion of the plurality of free layers has a perpendicular anisotropy energy and a demagnetization energy, the perpendicular anisotropy energy being less than the demagnetization energy.

7. The magnetic junction of claim 6 wherein the pinned layer has a pinned layer perpendicular anisotropy energy and a pinned layer demagnetization energy, the pinned layer perpendicular anisotropy energy being less than the pinned layer demagnetization energy.

8. The magnetic junction of claim 1 wherein the pinned layer has a pinned layer perpendicular anisotropy energy and a pinned layer demagnetization energy, the pinned layer perpendicular anisotropy energy being greater than the pinned layer demagnetization energy.

9. The magnetic junction of claim 1 wherein the pinned layer has a pinned layer perpendicular anisotropy energy and a pinned layer demagnetization energy, the pinned layer perpendicular anisotropy energy being less than the pinned layer demagnetization energy.

10. The magnetic junction of claim 1 wherein at least a portion of the plurality of free layers include a plurality of sublayers.

11. The magnetic junction of claim 1 wherein the pinned layer includes a plurality of sublayers.

12. The magnetic junction of claim 11 wherein the pinned layer is a synthetic antiferromagnet.

13. A magnetic memory comprising:
a plurality of magnetic storage cells, each of the plurality of magnetic storage cells including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of at least a portion of the plurality of free layers having an easy-cone anisotropy such that a magnetic moment of each of the at least the portion of the plurality of free layers is stable canted at an angle that from a normal to a plane of the plurality of free layers, the angle being greater than zero and less than ninety degrees; and
a plurality of bit lines.

14. The magnetic memory of claim 13 wherein the critical switching current density of each of the plurality of free layers decreases monotonically with increasing distance from the pinned layer.

15. The magnetic memory of claim 13 wherein the critical switching current density of each of the plurality of free layers increases monotonically with increasing distance from the pinned layer.

16. The magnetic memory of claim 13 wherein each of the plurality of free layers has a perpendicular anisotropy energy and a demagnetization energy, the perpendicular anisotropy energy being greater than the demagnetization energy.

17. A method for programming a magnetic junction for use in a magnetic device comprising:
applying a plurality of write currents to the magnetic junction, the magnetic junction including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current of the plurality of write currents is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of the plurality of write currents corresponding to the critical switching current density of one of the plurality of free layers, each of at least a portion of the plurality of free layers having an easy-cone anisotropy such that a magnetic moment of each of the at least the portion of the plurality of free layers is stable canted at an angle that from a normal to a plane of the plurality of free layers, the angle being greater than zero and less than ninety degrees.

18. The method of claim 17 wherein each of the plurality of write currents is a direct current pulse having an amplitude corresponding to the critical current density of one of the plurality of free layers.

19. A method for programming a magnetic junction for use in a magnetic device comprising:
applying a plurality of write currents to the magnetic junction, the magnetic junction including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current of the plurality of write currents is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of the plurality of write currents corresponding to the critical switching current density of one of the plurality of free layers, wherein each of the plurality of free layers has a Larmor frequency, and wherein each of the plurality of write currents include a direct current (DC) component and an alternating current (AC) component, the DC component having an amplitude corresponding to the critical current density of one of the plurality of free layers, the AC component having a frequency corresponding to the Larmor frequency of the one of the plurality of free layers.

20. A method for programming a magnetic junction for use in a magnetic device comprising:
applying a plurality of write currents to the magnetic junction, the magnetic junction including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current of the plurality of write currents is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of the plurality of write currents corresponding to the critical switching current density of one of the plurality of free layers, wherein each of the plurality of write currents is a direct current pulse having an amplitude corresponding to the critical current density of one of the plurality of free layers, wherein each of the plurality of free layers has a Larmor frequency, and wherein the method further includes:

applying an external alternating magnetic field with the frequency equal to the Larmor frequency of one of the plurality of free layers.

21. A method for programming a magnetic junction for use in a magnetic device comprising:

applying a plurality of write currents to the magnetic junction, the magnetic junction including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current of the plurality of write currents is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of the plurality of write currents corresponding to the critical switching current density of one of the plurality of free layers, wherein each of the plurality of free layers has a Larmor frequency, and wherein each of the plurality of write currents include a plurality of pulses having an amplitude corresponding to the critical current density of one of the plurality of free layers and a frequency corresponding to the Larmor frequency of the one of the plurality of free layers.

22. A magnetic junction for use in a magnetic device comprising:

a pinned layer;

a plurality of nonmagnetic spacer layers; and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current is passed through the magnetic junction, each of the plurality of free layers having a critical switching current density, the critical switching current density of one of the plurality of free layers changing monotonically from the critical switching current density of an adjacent free layer of the plurality of free layers, each of the plurality of free layers having a Larmor frequency different from the Larmor frequency of another of the plurality of free layers such that each of the plurality of free layers may be written with a write current including a plurality of pulses having an amplitude corresponding to the critical current density of one of the plurality of free layers and a frequency corresponding to the Larmor frequency of the one of the plurality of free layers.

23. A magnetic memory comprising:

a plurality of magnetic storage cells, each of the plurality of magnetic storage cells including a pinned layer, a plurality of nonmagnetic spacer layers, and a plurality of free layers interleaved with the plurality of nonmagnetic spacer layers, a first nonmagnetic spacer layer of the plurality of nonmagnetic spacer layers being between the plurality of free layers and the pinned layer, each of the plurality of free layers being configured to be switchable between a plurality of stable magnetic states when a write current is passed through the magnetic junction, each of the plurality of free layers having a critical switching current density, the critical switching current density of one of the plurality of free layers changing monotonically from the critical switching current density of an adjacent free layer of the plurality of free layers, the adjacent free layer being between the pinned layer and the one of the plurality of free layers, each of the plurality of free layers having a Larmor frequency different from the Larmor frequency of another of the plurality of free layers such that each of the plurality of free layers may be written with a write current including a plurality of pulses having an amplitude corresponding to the critical current density of one of the plurality of free layers and a frequency corresponding to the Larmor frequency of the one of the plurality of free layers.

* * * * *